(12) United States Patent
Takaya et al.

(10) Patent No.: US 10,770,579 B2
(45) Date of Patent: Sep. 8, 2020

(54) SIC-MOSFET AND METHOD OF MANUFACTURING THE SAME

(71) Applicants: TOYOTA JIDOSHA KABUSHIKI KAISHA, Toyota-shi, Aichi-ken (JP); DENSO CORPORATION, Kariya-shi, Aichi (JP)

(72) Inventors: Hidefumi Takaya, Toyota (JP); Yasushi Urakami, Kariya (JP); Yukihiko Watanabe, Nagakute (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/816,697

(22) Filed: Nov. 17, 2017

(65) Prior Publication Data
US 2018/0182889 A1     Jun. 28, 2018

(30) Foreign Application Priority Data

Dec. 27, 2016  (JP) ................. 2016-254046

(51) Int. Cl.
*H01L 29/78*     (2006.01)
*H01L 29/66*     (2006.01)
(Continued)

(52) U.S. Cl.
CPC ...... *H01L 29/7813* (2013.01); *H01L 29/1095* (2013.01); *H01L 29/1608* (2013.01);
(Continued)

(58) Field of Classification Search
CPC .......... H01L 29/1608; H01L 29/66734; H01L 29/7813
See application file for complete search history.

(56) References Cited

U.S. PATENT DOCUMENTS 6,297,101 B1 * 10/2001 Schaeffer .......... H01L 21/26586
                                                    438/268
9,916,981 B2 *  3/2018 Ohashi .................. H01L 21/047
(Continued)

FOREIGN PATENT DOCUMENTS

JP     2001-339064 A     12/2001
JP     2009-283540 A     12/2009
(Continued)

*Primary Examiner* — Cuong Q Nguyen
*Assistant Examiner* — Peter M Albrecht
(74) *Attorney, Agent, or Firm* — Oliff PLC

(57) ABSTRACT

An n-type drift region, a p-type first body region and a p-type contact region are formed on an SiC substrate by epitaxial growth. An opening is formed within the contact region by etching such that the first body region is exposed through the opening, and a p-type second body region is formed on the first body region exposed through the opening by epitaxial growth. An n-type source region is formed by epitaxial growth, and an opening is formed within a part of the source region located on the contact region by etching such that the contact region is exposed through the opening. A trench is formed by etching such that the trench extends from the source region to the drift region through the opening of the contact region, and a gate insulating film and a gate electrode are formed within the trench.

9 Claims, 7 Drawing Sheets

(51) Int. Cl.
   *H01L 29/10*      (2006.01)
   *H01L 29/16*      (2006.01)
   *H01L 29/417*     (2006.01)

(52) U.S. Cl.
   CPC .. *H01L 29/41766* (2013.01); *H01L 29/66068* (2013.01); *H01L 29/66734* (2013.01)

(56) References Cited

U.S. PATENT DOCUMENTS

| | | |
|---|---|---|
| 2009/0200559 A1 | 8/2009 | Suzuki et al. |
| 2009/0289264 A1 | 11/2009 | Matsuki et al. |
| 2011/0095302 A1* | 4/2011 | Hikichi ................. H01L 29/456 257/77 |
| 2013/0306983 A1* | 11/2013 | Nakano ............... H01L 29/0623 257/76 |
| 2016/0064550 A1* | 3/2016 | Sugimoto ........... H01L 29/7813 257/330 |
| 2016/0351680 A1* | 12/2016 | Soeno ............... H01L 29/66068 |
| 2017/0012109 A1* | 1/2017 | Akagi ................. H01L 21/0465 |
| 2018/0145137 A1* | 5/2018 | Yamamoto .......... H01L 21/0465 |

FOREIGN PATENT DOCUMENTS

| | | | |
|---|---|---|---|
| JP | 2010-147228 A | 7/2010 | |
| JP | 2011-253929 A | 12/2011 | |
| WO | WO-2015111387 A1 * | 7/2015 | ......... H01L 29/1608 |

\* cited by examiner

SIC-MOSFET AND METHOD OF MANUFACTURING THE SAME

TECHNICAL FIELD

The technology disclosed herein relates to a metal-oxide-semiconductor field-effect transistor (MOSFET) using silicon carbide (SiC) as a semiconductor material and a method for manufacturing the same.

BACKGROUND

Japanese Patent Application Publication No. 2001-339064 discloses a MOSFET. This MOSFET includes a semiconductor substrate, and an insulated gate electrode located within a trench defined on the semiconductor substrate. The semiconductor substrate includes an n-plus type drain region, an n-minus type drift region located on the drain region, a p-minus type body region located on the drift region, an n-plus type source region located on the body region, the source region appearing on a surface of the semiconductor substrate, and a p-plus type contact region located on the body region, the contact region appearing an the surface of the semiconductor substrate. The trench extends from the surface of the semiconductor substrate to the drift region through the body region. The source region appears on the inner surface of the trench and faces the gate electrode via a gate insulating film. A part of the contact region is located under the source region.

SUMMARY

In the MOSFET described above, the part of the contact region is located under the source region, and is located between the source region and the body region. With such a structure, when a forward current flows through a body diode of the MOSFET, a wide current path with low resistance is formed. As a result, a forward voltage of the body diode decreases. When the forward voltage of the body diode decreases, energy loss that occurs in the body diode when the body diode is used, for example, as a free-wheeling diode can be reduced.

In recent years, development for putting a MOSFET using SiC as a semiconductor material (hereinafter, referred to as SiC-MOSFET) into practical use has been being made. In the SiC-MOSFET, the forward voltage of the body diode is liable to be higher than that in a MOSFET using silicon (Si) (hereinafter, referred to as Si-MOSFET). Thus, it is probable that the above-described structure including the contact region is especially advantageous to the SiC-MOSFET. However, it has been found that, even when related-art structures are applied as they are to the SiC-MOSFET, the forward voltage of the body diode is not sufficiently reduced depending on a method for forming the contact region.

In related-art structures, the contact region located under the source region is formed by ion implantation of p-type impurities and thermal diffusion. When the contact region is formed by the ion implantation and the thermal diffusion, a concentration of the p-type impurities within the contact region becomes lower toward an outer side of the contact region. As a result, a boundary of the contact region cannot be definitely formed. In order to reduce the forward voltage of the body diode, it may be appropriate to form the contact region as wide as possible out of a region where a channel is formed by the gate electrode (that is, region near the trench). However, by the ion implantation and the thermal diffusion, it is difficult to form the contact region with a sufficient concentration of the p-type impurities accurately up to a vicinity of the region where the channel is formed. Such problems, which may be insignificant in the Si-MOSFETs, are serious in the SiC-MOSFETs in which the forward voltage of the body diode is intrinsically high.

In view of such circumstances, the present disclosure provides a technology for reducing a forward voltage of a body diode in a SiC-MOSFET.

Herein are disclosed a method for manufacturing an SiC-MOSFET. The method comprises: preparing an n-type SiC substrate; forming an n-type drift region on the SiC substrate by epitaxial growth, the drift region including n-type impurities at a concentration lower than the SiC substrate; forming a p-type first body region on the drift region by epitaxial growth; forming a p-type contact region on the first body region by epitaxial growth, the contact region including p-type impurities at a concentration higher than the first body region; forming an opening within the contact region by etching such that the first body region is exposed through the opening; forming a p-type second body region on the first body region exposed within the opening by epitaxial growth, the second body region including p-type impurities at a concentration lower than the contact region; forming an n-type source region on the contact region and the second body region within the opening by epitaxial growth, the source region including n-type impurities at a concentration higher than the drift region; forming an opening within a part of the source region located on the contact region by etching such that the contact region is exposed through the opening; forming a trench by etching such that the trench extends from the source region to the drift region through the opening of the contact region; and forming a gate insulating film and a gate electrode within the trench.

According to the method described above, an SiC-MOSFET is manufactured with the following structures. That is, the SiC-MOSFET comprises an SiC substrate and a gate electrode located within a trench defined on the SiC substrate. The SiC substrate comprises: an n-type drain region; an n-type drift region located on the drain region and including n-type impurities at a concentration lower than the drain region; a p-type body region located on the drift region; a p-type contact region located on the body region, the contact region appearing on a surface of the SiC substrate and including p-type impurities at a concentration higher than the body region; and an n-type source region located on the body region, the source region appearing on the surface of the SiC substrate and including n-type impurities at a concentration higher than the drift region. The trench extends from the surface of the SiC substrate to the drift region though the body region. The gate electrode faces the source region, body region and drift region via a gate insulating film. The contact region is a layer formed by epitaxial growth and includes a portion located between the source region and body region at a location apart from the trench.

In the SiC-MOSFET described above, the contact region includes the portion located between the source region and the body region. With such a configuration, the forward voltage of the body diode can be reduced as described above. In addition, the contact region is formed by epitaxial growth. The contact region formed by epitaxial growth can have the p-type impurities at a uniform concentration as a whole, and have a definite boundary. With this, the contact region with a sufficient concentration of the p-type impurities can be formed accurately up to a vicinity of a region where a channel is formed. As a result, when the forward current flows through the body diode, a wider current path with low resistance is formed. As a result, the forward voltage of the body diode significantly decreases.

DETAILED DESCRIPTION

Figure 1:
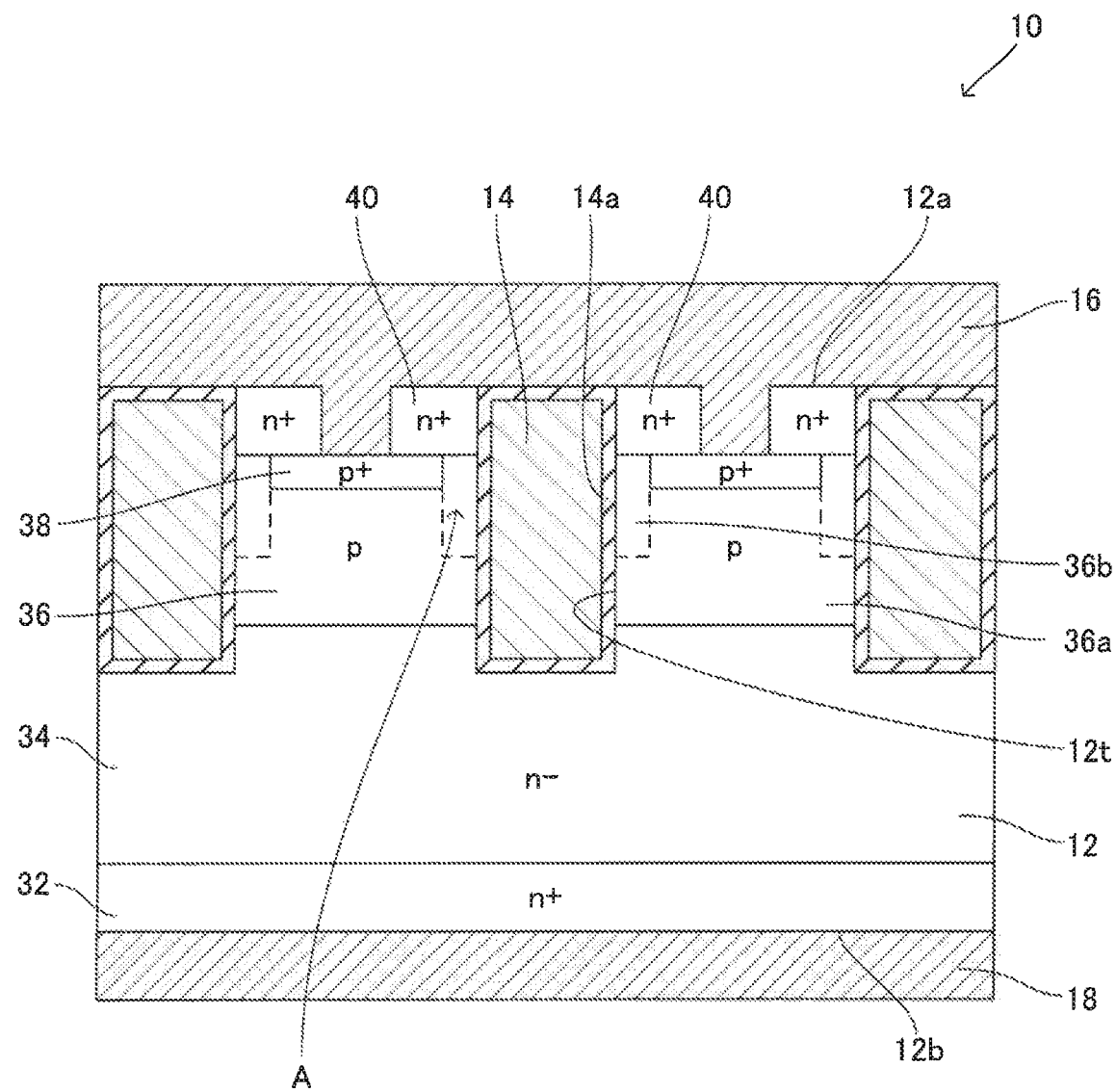
FIG. 1 is a sectional view of a structure of a MOSFET 10 according to an embodiment of the present teachings.

In one or more embodiments of the present teachings, the forming of the second body region may comprise: forming the second body region on the contact region a well as on the first body region; and removing the second body region formed on the contact region so as to expose the contact region. According to such an embodiment, epitaxial growth of the second body region can be performed all over the SiC substrate without preparing masks and the like. Note that, according to another embodiment, the masks and the like may be utilized such that epitaxial growth of the second body region can be selectively performed only on the first body region.

In one or more embodiments of the present teachings, the concentration of the p-type impurities within the second body region may be lower than the concentration of the p-type impurities within the first body region. The second body region refers to a part adjacent to the trench, and includes at least a part of the region where the channel is formed. Thus, when the concentration of the p-type impurities within the second body region is lower than the concentration of the p-type impurities within the first body region, a resistance of the channel decreases. As a result, an ON resistance of the MOSFET can be reduced.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other teachings and teachings to provide improved SiC-MOSFET, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Now, with reference to the drawings, a MOSFET 10 according to an embodiment of the present teachings and a method for manufacturing the same will be described. Although not particularly limited, the MOSFET 10 according to this embodiment can be used as a switching device in power conversion circuits such as a converter and an inverter, for example, for a hybrid car and electric automobiles such as a fuel cell car and an electric car. In the following, a structure of the MOSFET 10 will be described first, and then a method for manufacturing the MOSFET 10 will be described. Note that, the MOSFET 10 and the method for manufacturing the same are merely examples, and hence a plurality of technical features disclosed herein may be applied alone or in combination to various semiconductor devices and methods for manufacturing the same.

FIG. 1 is a sectional view of the structure of the MOSFET 10 according to this embodiment. Although FIG. 1 shows only a partial cross-section of the MOSFET 10, in the MOSFET 10 the unit structures shown in FIG. 1 are repeatedly formed. As shown in FIG. 1, the MOSFET 10 according to this embodiment includes an SiC substrate 12 constituted of silicon carbide (SiC), and gate electrodes 14 located within trenches 12t defined on a top surface 12a of the SiC substrate 12. A gate insulating film 14a is formed on inner surfaces of each of the trenches 12t. The gate electrodes 14 each face the trench 12t via the gate insulating film 14a. The gate electrodes 14 may be constituted of conductive materials such as polysilicon. The gate insulating film 14a may be constituted of insulating materials such as silicon dioxide ($SiO_2$). Specific materials for the gate electrodes 14 and the gate insulating films 14a are not particularly limited.

The MOSFET 10 further includes a source electrode 16 provided on the top surface 12a of the SiC substrate 12, and a drain electrode 18 provided on a bottom surface 12b of the SiC substrate 12. The source electrode 16 is in ohmic contact with the top surface 12a of the SiC substrate 12, and the drain electrode 18 is in ohmic contact with the bottom surface 12b of the SiC substrate 12. The source electrode 16 and the drain electrode 18 can be constituted of conductive materials such as aluminum (Al), nickel (Ni), titanium (Ti), and gold (Au). Specific materials for the source electrode 16 and the drain electrode 18 are not particularly limited.

Note that, the top surface 12a of the SIC substrate 12 refers to one surface of the SiC substrate 12, and the bottom surface 12b of the SiC substrate 12 refers to another surface of the SiC substrate 12 located on a side opposite to the top surface 12a. Herein, the phrases "top surface" and "bottom surface" are used for the sake of convenience in distinguishing the two surfaces located on the sides opposite to each other. For example, the top surface 12a of the SiC substrate 12 is not necessarily located on a vertically upper side. Depending on a posture of the SiC substrate 12, the top surface 12a may be located on a vertically lower side, and the bottom surface 12b may be located on the vertically upper side.

The SiC substrate 12 includes a drain region 32, a drift region 34, body regions 36, contact regions 38, and source regions 40. The drain region 32 is located along the bottom surface 12b of the SiC substrate 12, and appears on the bottom surface 12b. The drain region 32 is an n-type region. As examples of n-type impurities within the drain region 32, there are given group V elements (group 15 elements) such as phosphorus. The drain electrode 18 mentioned above is in ohmic contact with the drain region 32.

The drift region 34 is located on the drain region 32, and is adjacent to the drain region 32. The drift region 34 is an n-type region. A concentration of n-type impurities within the drift region 34 is lower than a concentration of the n-type impurities within the drain region 32. As examples of the n-type impurities within the drift region 34, there are given group V elements (group 15 elements) such as phosphorus.

The body regions 36 are located on the drift region 34, and are adjacent to the drift region 34. The body regions 36 are separated from the drain region 32 at least via the drift region 34. The body regions 36 are p-type regions. As examples of p-type impurities within the body regions 36, there are given group III elements (group 13 elements) such as boron (B) and aluminum (Al).

The contact regions 38 are located on the body regions 36, and appear on the top surface 12a of the SiC substrate 12. The contact regions 38 are p-type regions. A concentration of p-type impurities within the contact regions 38 is higher than a concentration of the p-type impurities within the body regions 36. As examples of the p-type impurities within the contact regions 38, there are given group II elements (group 13 elements) such as boron (B) and aluminum (Al). The source electrode 16 mentioned above is in ohmic contact with the contact regions 38.

The source regions 40 are located on the body regions 36, and appear on the top surface 12a of the SiC substrate 12. The source regions 40 are separated from the drift region 34 at least via the body regions 36. The source regions 40 are n-type regions. A concentration of n-type impurities within the source regions 40 is higher than the concentration of the n-type impurities within the drift region 34. As examples of the n-type impurities within the source regions 40, there are given group V elements (group 15 elements) such as phosphorus. The source electrode 16 mentioned above is in ohmic contact also with the source regions 40.

The trenches 12t extend from the top surface 12a of the SiC substrate 12 to the drift region 34 through the source regions 40 and the body regions 36. The source regions 40 are located on both horizontal sides of each of the trenches 12t, and are adjacent to each of the trenches 12t. The gate electrodes 14 within the trenches 12t face the source regions 40, the body regions 36, and the drift region 34 via the gate insulating films 14a. A region (denoted by "A" in FIG. 1) within each of the body regions 36 adjacent to the trench 12t is a region where a channel is formed by the gate electrode 14. In other words, when a voltage that makes the gate electrode 14 positive relative to the source electrode 16 is applied to the gate electrode 14, the region A within each of the body regions 36 adjacent to the trench 12t is inverted to an n-type. With this, n-type channels that connect the source regions 40 and the drift region 34 are formed along the trenches 12t. In the following, the regions where those channels are formed will be referred to as channel-formation regions A. The channel-formation regions A each normally have a thickness of several tens of nm from the horizontal side of the trench 12t.

The MOSFET 10 includes a built-in body diode. This body diode is a p-n junction diode constituted of p-type region including the p-type contact regions 38, the p-type body regions 36, and n-type region including the n-type drift region 34, and the n-type drain region 32. The body diode of the MOSFET 10 can be utilized, for example, as a freewheeling diode. However, the MOSFET 10 according to this embodiment is a SiC-MOSFET formed by using SiC as a semiconductor material. In the SiC-MOSFET, a forward voltage of the body diode is liable to be higher than that in a Si-MOSFET. This forward voltage of the body diode refers to a voltage drop that occurs in the body diode when a forward current flows through the body diode, which depends on a resistance of the body diode. Further, the forward current refers to a current that flows from the contact regions 38 toward the drain region 32.

In order to overcome the disadvantage described above, in the MOSFET 10 according to this embodiment, parts of the contact regions 38 are located under the source regions 40 (bottom surface 12b side), and are located between the source regions 40 and the body regions 36. With such a structure, when the forward current flows through the body diode of the MOSFET 10, a wide current path with low resistance is formed. As a result, the forward voltage of the body diode decreases. When the forward voltage of the body diode decreases, energy loss that occurs in the body diode when the forward current flows through the body diode can be reduced.

Note that, the contact regions 38 between the source regions 40 and the body regions 36 are located apart from the trenches 12t such that and the channel-formation regions A are secured between the trenches 12t and the contact regions 38. By such a disposition for securing the channel-formation regions A, influence on formation of the channels by the gate electrodes 14 is eliminated, and an ON resistance of the MOSFET 10 does not increase. In other words, the contact regions 38 are formed as wide as possible within ranges out of the channel-formation regions A, and thereby the forward voltage of the body diode can be significantly reduced without increasing the ON resistance of the MOSFET 10.

Although to be described in detail later, in the MOSFET 10 according to this embodiment, the contact regions 38 are formed by epitaxial growth. The contact regions 38 formed by epitaxial growth can have the p-type impurities at a uniform concentration, and each have a definite boundary. With this, the contact regions 38 with a sufficient concentration of the p-type impurities can be formed accurately up to vicinities of the channel-formation regions A. As a result, since the current path with low resistance is broadly formed when the forward current flows through the body diode, the forward voltage of the body diode significantly decreases. Further, since the contact regions 38 with the sufficient concentration of the p-type impurities are widely formed, an avalanche resistance of the MOSFET 10 is also increased.

By forming the contact regions 38 by epitaxial growth, leakage current of the MOSFET 10 also can be reduced. When the contact regions 38 are formed by ion implantation and thermal diffusion, the contact regions 38 may be unintendedly enlarged to generate the leakage current. In contrast, the contact regions 38 are formed by epitaxial growth, and thereby the contact regions 38 can each be formed accurately within a desired range. With this, the generation of the leakage current can be prevented.

In the MOSFET 10 according to this embodiment, the source regions 40 are provided to protrude with respect to the contact regions 38 such that a trench contact structure is defined between the top surface 12a of the SiC substrate 12 and the source electrode 16. The trench contact structure refers to a structure in which a surface of a semiconductor substrate and surfaces of electrodes in contact therewith are formed to have projections and recesses such that both the surfaces are in contact with each other over a large area. According to the trench contact structure, each of intervals between the trenches 12t is set small, thereby downsizing the MOSFET 10.

In the MOSFET 10 according to this embodiment, the source regions 40 are also formed by epitaxial growth. If the source regions 40 are formed by epitaxial growth, defects are less liable to occur therein. With this, the leakage current of the MOSFET 10 can be reduced. Further, by epitaxial growth, the source regions 40 can be widely formed.

In the MOSFET 10 according to this embodiment, the body regions 36 are also formed by epitaxial growth. Specifically, the body regions 36 each include a first body region 36a and second body regions 36b. Although not described in detail here, the first body region 36a and the second body regions 36b are formed by epitaxial growth in steps independent of each other. Thus, a concentration of the p-type impurities within the first body region 36a and a concentration of the p-type impurities within the second body regions 36b can be set unequal to each other. The second body regions 36b refer to parts adjacent to the trench 12t, and each include at least a part of the channel-formation region A. Thus, according to another embodiment, the concentration of the p-type impurities within the second body regions 36b may be made lower than the concentration of the p-type impurities within the first body region 36a. With such a configuration, a resistance of the channel can be reduced, and hence the ON resistance of the MOSFET 10 can be reduced. Note that, according to still another embodiment, the concentration of the p-type impurities within the first body region 36a and the concentration of the p-type impurities within the second body region 36b may be made equal to each other.

Figure 2:
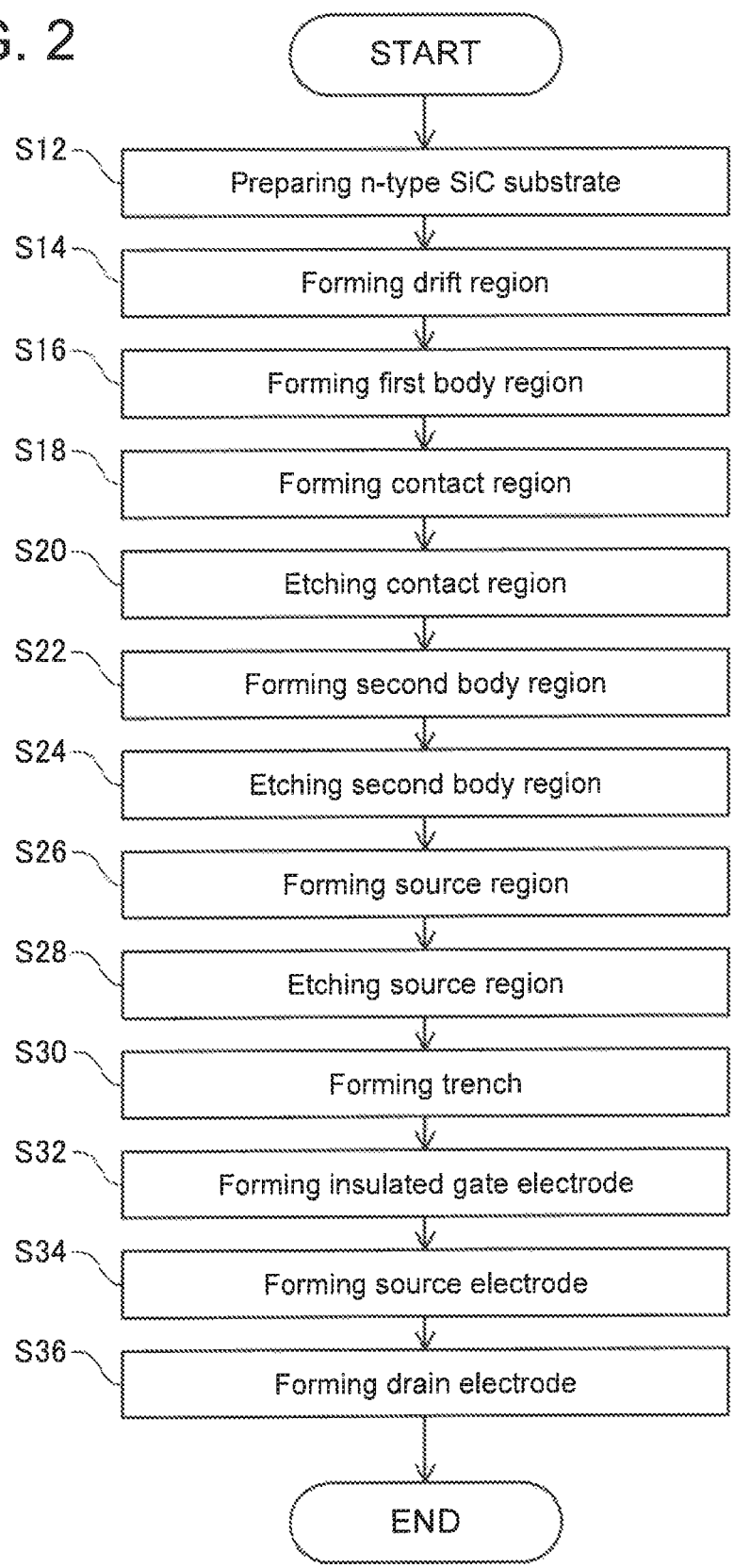
FIG. 2 is a flowchart showing a flow of a method for manufacturing the MOSFET 10.
Figure 3:
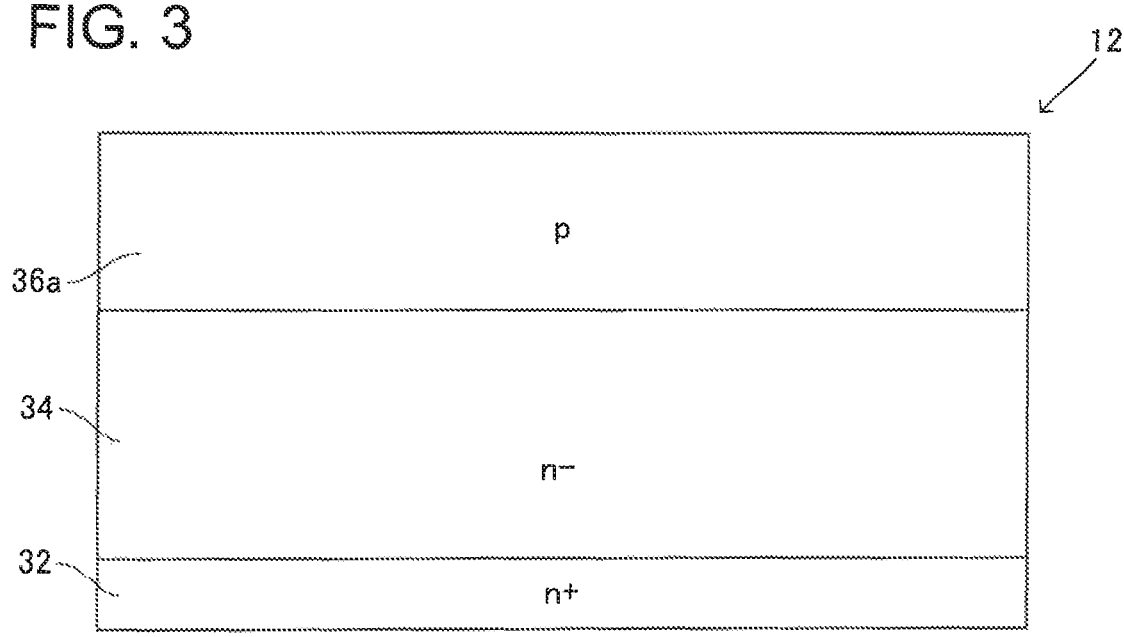
FIG. 3 is an explanatory view showing a step in the method for manufacturing the MOSFET 10.

Next, a method for manufacturing the MOSFET 10 will be described. As shown in FIG. 2 and FIG. 3, in Step S12, an n-type SiC substrate 32 is prepared first. This SiC substrate 32 serves as a drain region 32 shown in FIG. 1, and hence, for the sake of convenience of description, is represented by the same reference numeral "32." Then, in Step S14, an n-type drift region 34 is formed on the SiC substrate 32 by epitaxial growth of SiC. As described above, the concentration of the n-type impurities within the drift region 34 is made lower than the concentration of the n-type impurities within the drain region 32. Next, in Step S16, a p-type first body region 36a is formed on the drift region 34 by epitaxial growth of SiC. Through those steps, as shown in FIG. 3, an SiC substrate 12 including three layers of the drain region 32, the drift region 34, and the first body region 36a is manufactured.

Figure 4:
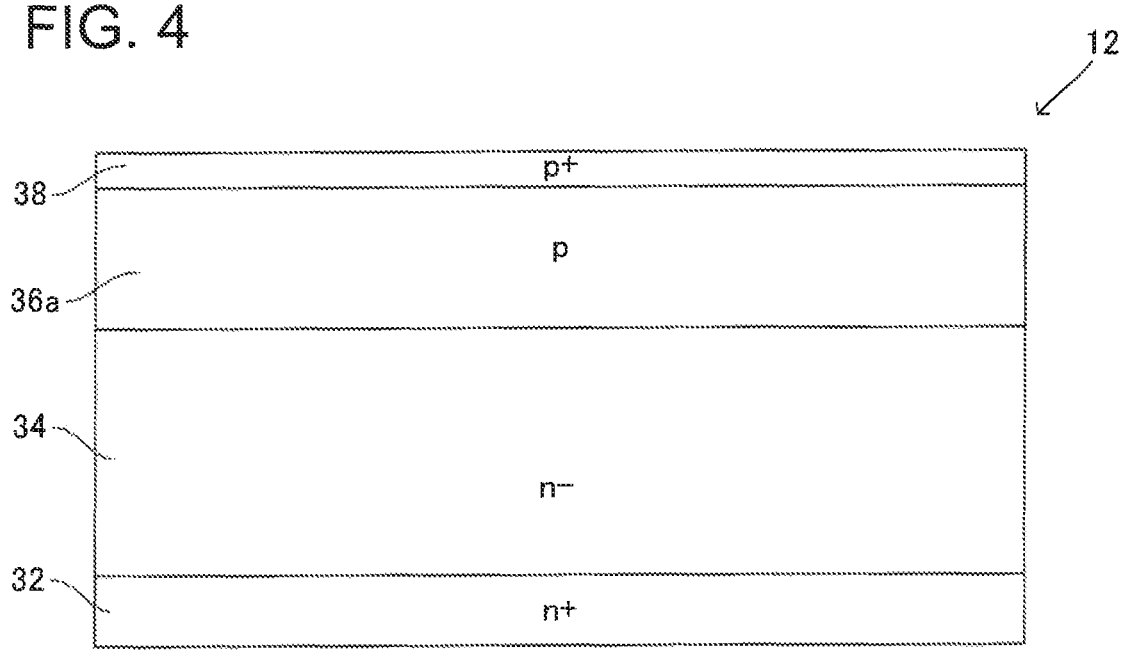
FIG. 4 is an explanatory view showing another step in the method for manufacturing the MOSFET 10.

Next, as shown in FIG. 2 and FIG. 4, in Step S18, a p-type contact region 38 is formed on the first body region 36a by epitaxial growth of SiC. As described above, the concentration of the p-type impurities within the contact region 38 is made higher than the p-type impurities within the first body region 36a. At this stage, the contact region 38 is formed all over the first body region 36a.

Figure 5:
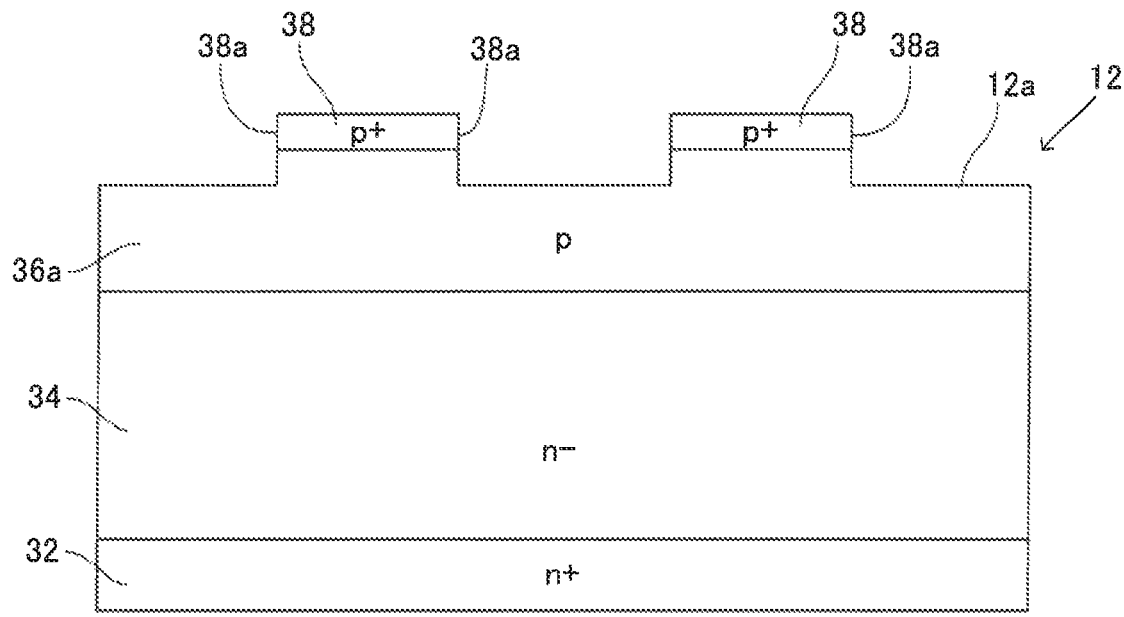
FIG. 5 is an explanatory view showing still another step in the method for manufacturing the MOSFET 10.

After that, as shown in FIG. 2 and FIG. 5, in Step S20, within the contact region 38, openings 38a that expose the first body region 36a are formed by etching. At this time, not only parts of the contact region 38 but also parts of the first body region 36a may be removed by etching. Although not shown, in Step S18, in order that the parts of the contact region 38 are selectively removed, one or a plurality of masks are used as appropriate.

Figure 6:
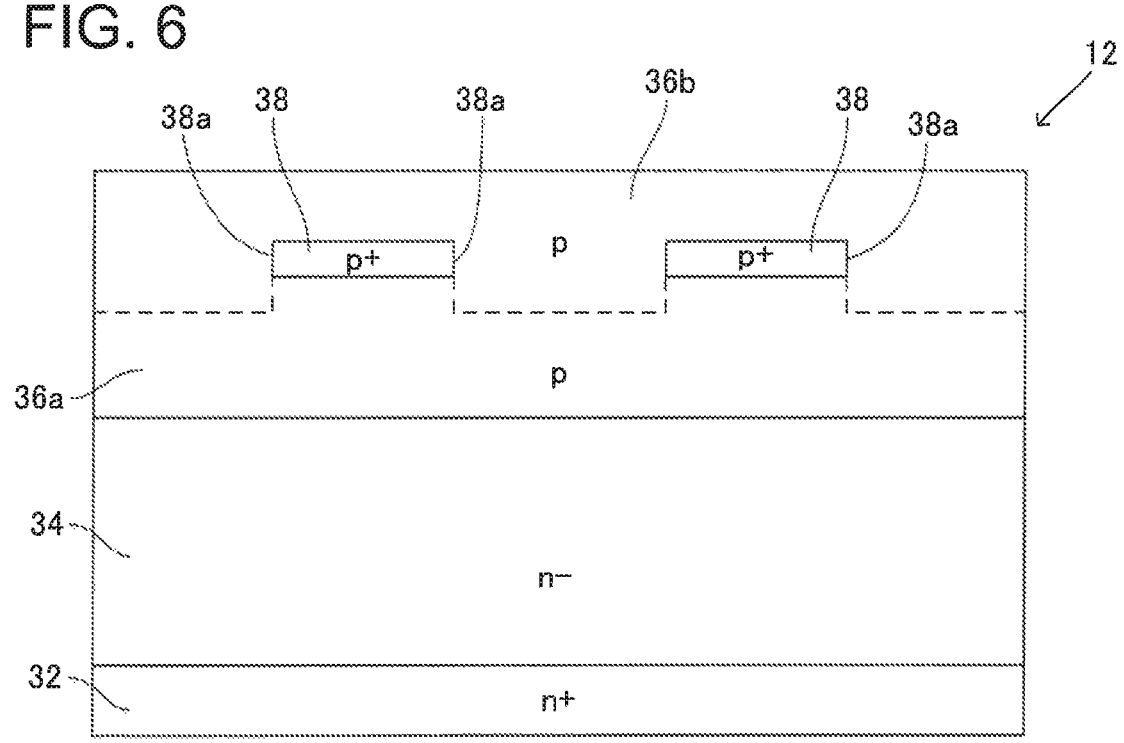
FIG. 6 is an explanatory view showing yet another step in the method for manufacturing the MOSFET 10.

Then, as shown in FIG. 2 and FIG. 6, in Step S22, on the top surface 12a of the SiC substrate 12 after Step S20 described above (refer to FIG. 5), p-type second body region 36b is formed by epitaxial growth of SiC. With this, the second body region 36b is formed over the contact regions 38 and parts of the first body region 36a exposed through the openings 38a of the contact regions 38. As described above, the concentration of the p-type impurities within the second body region 36b is made lower than the concentration of the p-type impurities within the contact regions 38. Further, when the concentration of the p-type impurities within the second body region 36b is made lower than the concentration of the p-type in the first body region 36a formed in Step S16, ON resistance of the MOSFET 10 can be reduced.

Figure 7:
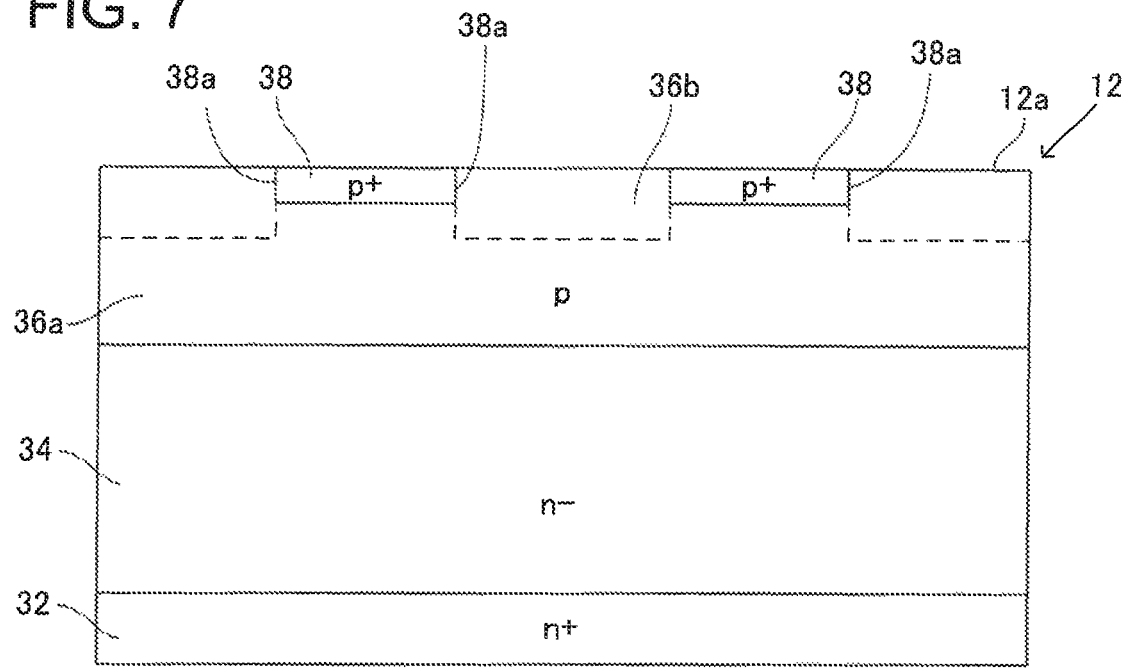
FIG. 7 is an explanatory view showing yet another step in the method for manufacturing the MOSFET 10.

Next, as shown in FIG. 2 and FIG. 7, in Step S24, the second body region 36b6 is etched until the contact regions 38 are exposed. With this, parts of the second body region 36b formed on the contact regions 38 are removed. At this stage, the body region 36 (refer to FIG. 1) including the first body regions 36a and the second body regions 36b is formed within the SiC substrate 12. Note that, in Step S22 described above, a mask may be used as appropriate such that the second body regions 36b are formed by epitaxial growth only on the parts of the first body region 36a that are exposed through the openings 38a of the contact regions 38. In this case, Step S24 of removing the parts of the second body region 36b by etching can be omitted.

Figure 8:
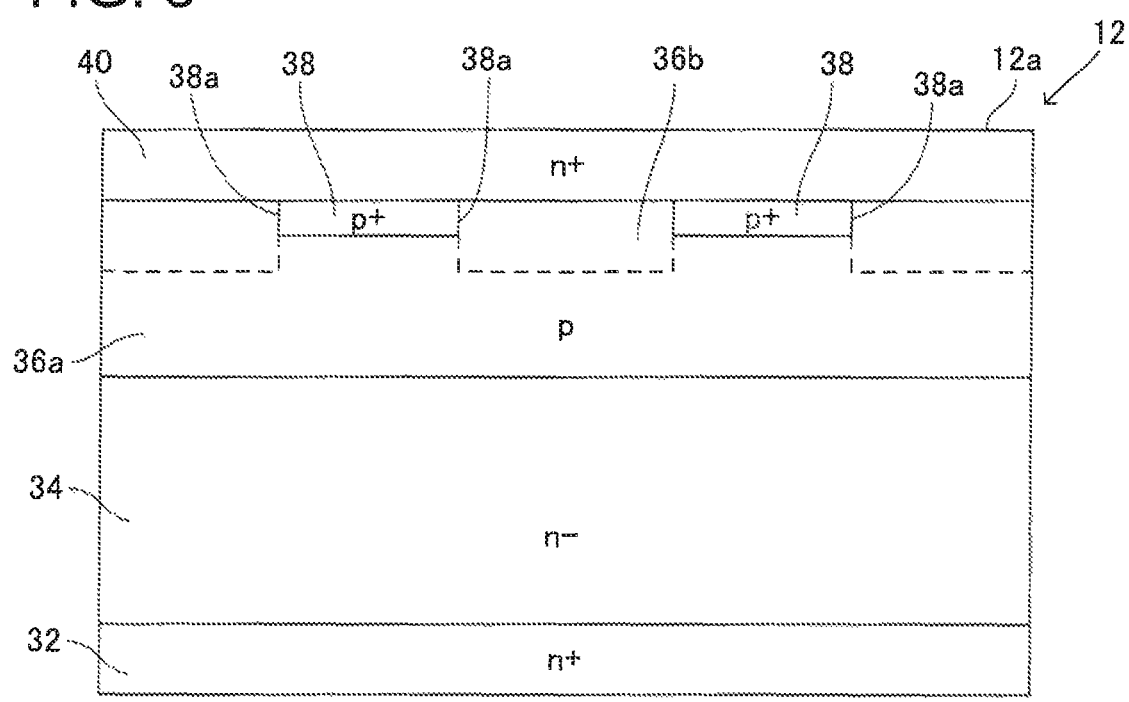
FIG. 8 is an explanatory view showing yet another step in the method for manufacturing the MOSFET 10.

After that, as shown in FIG. 2 and FIG. 8, in Step S26, on the top surface 12a of the SiC substrate 12 after Step S24 described above (refer to FIG. 7), an n-type source region 40 is formed by epitaxial growth of SiC. With this, the source region 40 is formed over the contact regions 38 and the second body regions 36b exposed through the openings 38a of the contact regions 38. As described above, the concentration of the n-type impurities within the source region 40 is made higher than the concentration of the n-type impurities within the drift region 34.

Figure 9:
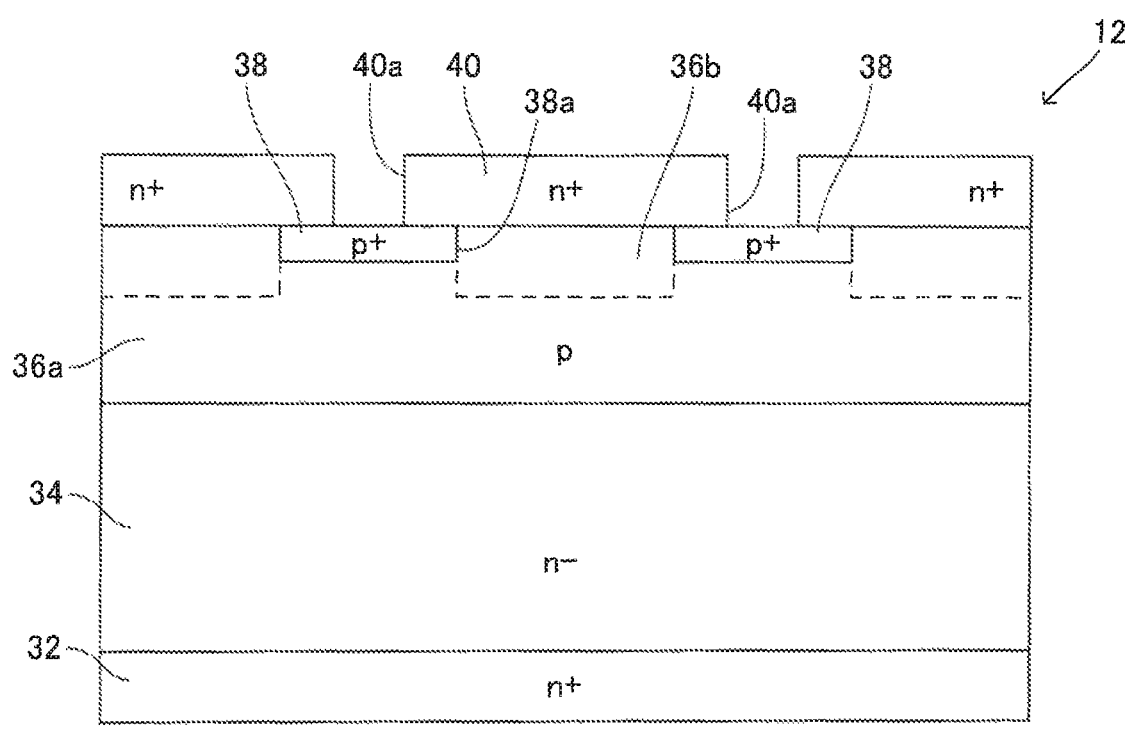
FIG. 9 is an explanatory view showing yet another step in the method for manufacturing the MOSFET 10.

Then, as shown in FIG. 2 and FIG. 9, in Step S28, openings 40a that expose the contact regions 38 are formed by etching within the source region 40. Those openings 40a are formed at parts of the source region 40 located on the contact regions 38 in a manner that the parts of the contact regions 38 are left between the source regions 40 and the first body region 36a. With this, the trench contact structure described above is formed.

Figure 10:
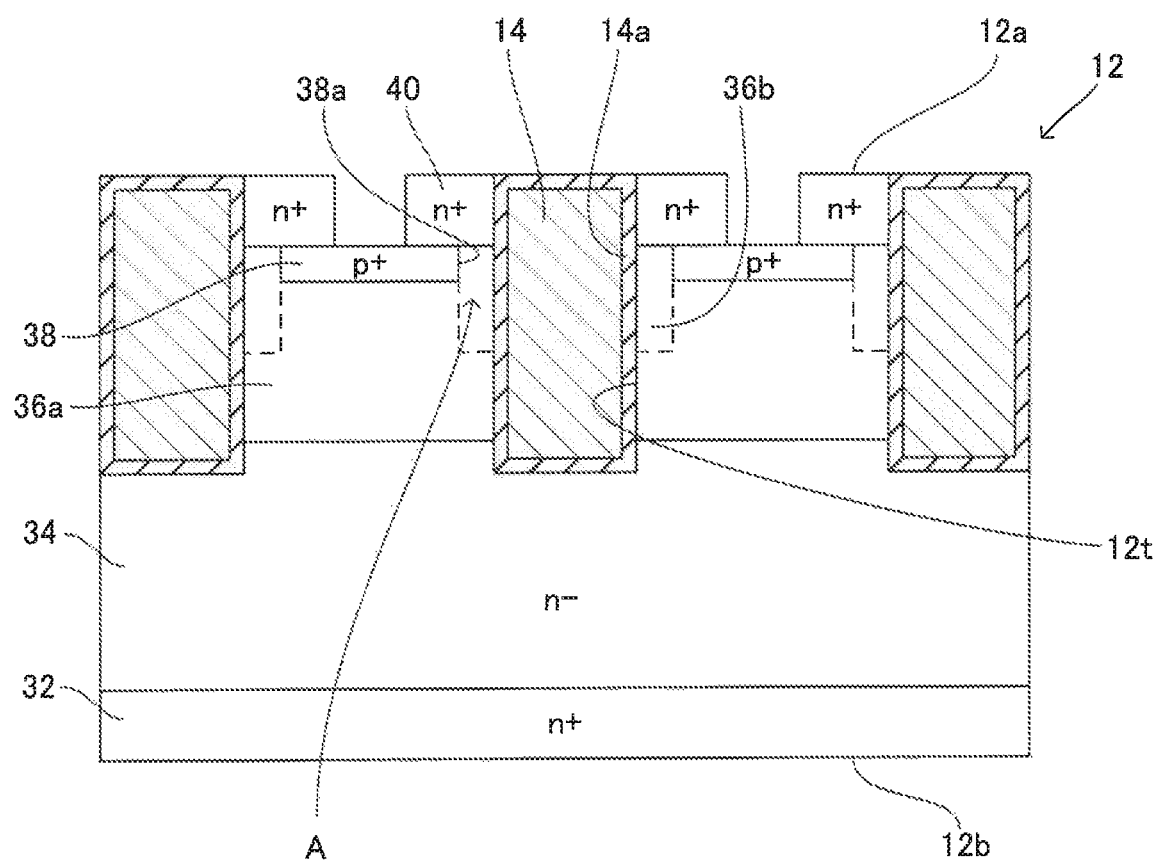
FIG. 10 is an explanatory view showing yet another step in the method for manufacturing the MOSFET 10.

Next, as shown in FIG. 2 and FIG. 10, in Step S30, trenches 12t are defined by etching on the top surface 12a of the SiC substrate 12. Those trenches 12t extend from the source regions 40 to the drift region 34 through the openings 38a of the contact regions 38. By defining the trenches 12t through the openings 38a of the contact regions 38, the second body regions 36b are located between both the horizontal sides of each of the trenches 12t and the contact regions 38. With this, the channel-formation regions A are formed along the trenches 12t.

After that, in Step S32, the gate insulating film 14a and the gate electrode 14 are formed within each of the trenches 12t. Next, in Step S34, a source electrode 16 (refer to FIG. 1) is formed over the top surface 12a of the SiC substrate 12. In Step S36, a drain electrode 18 (refer to FIG. 1) is formed on the bottom surface 12b of the SiC substrate 12. In this way, the MOSFET 10 is manufactured. Note that, the method for manufacturing the MOSFET 10 may further include additional steps as appropriate.

What is claimed is:

1. A metal-oxide-semiconductor field-effect transistor using silicon carbide as a semiconductor material (SiC-MOSFET), comprising:
    a silicon carbide (SiC) substrate; and
    a gate electrode located within a trench defined on the SiC substrate,
    wherein the SiC substrate comprises:
        an n-type drain region;
        an n-type drift region located on the n-type drain region, a concentration of n-type impurities in the n-type drift region being lower than a concentration of the n-type impurities in the n-type drain region;
        a p-type body region located on the n-type drift region;
        a p-type contact region located on the p-type body region, the p-type contact region appearing on a surface of the SiC substrate and a concentration of p-type impurities in the p-type contact region being higher than a concentration of the p-type impurities in the p-type body region; and
        an n-type source region located on the p-type body region, the n-type source region appearing on the surface of the SiC substrate and a concentration of the n-type impurities in the n-type source region being higher than the concentration of the n-type impurities in the n-type drift region,
    the trench extends from the surface of the SiC substrate to the n-type drift region through the p-type body region,
    the gate electrode faces the n-type source region, the p-type body region and the n-type drift region via a gate insulating film,
    the p-type contact region is a layer formed by epitaxial growth and includes a portion located between the n-type source region and the p-type body region at a location apart from the trench,
    the p-type body region comprises a first body region and a second body region,
    a concentration of the p-type impurities in the second body region is lower than a concentration of the p-type impurities in a portion of the first body region that is in direct contact with the p-type contact region,
    the second body region is in direct contact with both the n-type source region and the p-type contact region, and appears on a side surface of the trench,
    the portion of the p-type contact region located between the n-type source region and the p-type body region is in direct contact with each of the first body region, the second body region and the n-type source region, and
    the second body region is separated from the n-type drift region via the first body region.

2. The SiC-MOSFET according to claim 1, wherein the first body region is separated from the n-type source region via the second body region and the p-type contact region.

3. The SiC-MOSFET according to claim 1, wherein the second body region is separated from the n-type drift region via the first body region such that the second body region does not directly contact with the n-type drift region.

4. The SiC-MOSFET according to claim 3, wherein the first body region is separated from the n-type source region via the second body region and the p-type contact region.

5. The SiC-MOSFET according to claim 1, further comprising a source electrode provided on the surface of the SiC substrate,
    wherein the surface of the SiC substrate comprises projections and recesses that are in direct contact with the source electrode, each recess being defined by adjacent two of the projections.

6. The SiC-MOSFET according to claim 5, wherein
    the n-type source region is in direct contact with the source electrode at top surfaces of the projections, and
    the p-type contact region is in direct contact with the source electrode at bottom surfaces of the recesses.

7. The SiC-MOSFET according to claim 6, wherein the n-type source region is further in direct contact with the source electrode at side surfaces of the projections.

8. The SiC-MOSFET according to claim 6, wherein the source electrode is in direct contact with both the n-type source region and the p-type contact region within the recesses.

9. The SiC-MOSFET according to claim 1, wherein
    the second body region is separated from the n-type drift region via the first body region such that the second body region does not directly contact with the n-type drift region,
    the first body region is separated from the n-type source region via the second body region and the p-type contact region,
    the SiC-MOSFET further comprises a source electrode provided on the surface of the SiC substrate,
    the surface of the SiC substrate comprises projections and recesses that are in direct contact with the source electrode, each recess being defined by adjacent two of the projections,
    the n-type source region is in direct contact with the source electrode at both top surfaces and side surfaces of the projections,
    the p-type contact region is in direct contact with the source electrode at bottom surfaces of the recesses, and
    the source electrode is in direct contact with both the n-type source region and the p-type contact region within the recesses.

* * * * *